United States Patent
Lee et al.

(10) Patent No.: US 8,084,344 B2
(45) Date of Patent: Dec. 27, 2011

(54) METHODS OF FABRICATING A SEMICONDUCTOR DEVICE

(75) Inventors: Jong-Won Lee, Seongnam-si (KR);
Sang-Yeob Han, Anyang-si (KR);
Chang-Ki Hong, Seongnam-si (KR);
Bo-Un Yoon, Seoul (KR); Jae-Dong Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 383 days.

(21) Appl. No.: 12/292,195

(22) Filed: Nov. 13, 2008

(65) Prior Publication Data
US 2009/0155991 A1 Jun. 18, 2009

(30) Foreign Application Priority Data
Dec. 13, 2007 (KR) .................. 10-2007-0130190

(51) Int. Cl.
*H01L 21/4763* (2006.01)
(52) U.S. Cl. ........................................ 438/586
(58) Field of Classification Search .................. 438/586
See application file for complete search history.

(56) References Cited

U.S. PATENT DOCUMENTS

| | | | | |
|---|---|---|---|---|
| 5,091,326 A * | 2/1992 | Haskell | ............ | 438/257 |
| 5,229,326 A * | 7/1993 | Dennison et al. | ............ | 438/586 |
| 6,010,935 A * | 1/2000 | Doan | ............ | 438/303 |
| 6,010,955 A * | 1/2000 | Hashimoto | ............ | 438/597 |
| 6,165,878 A * | 12/2000 | Haruhana et al. | ............ | 438/586 |
| 6,184,116 B1 * | 2/2001 | Shen et al. | ............ | 438/587 |
| 6,207,543 B1 * | 3/2001 | Harvey et al. | ............ | 438/586 |
| 6,218,272 B1 * | 4/2001 | Yeom et al. | ............ | 438/586 |
| 6,242,332 B1 * | 6/2001 | Cho et al. | ............ | 438/587 |
| 6,355,547 B1 * | 3/2002 | Lee et al. | ............ | 438/586 |
| 6,387,759 B1 * | 5/2002 | Park et al. | ............ | 438/275 |
| 6,429,107 B2 * | 8/2002 | Kim et al. | ............ | 438/586 |
| 6,440,830 B1 * | 8/2002 | Lopatin | ............ | 438/592 |
| 6,444,554 B1 * | 9/2002 | Adachi et al. | ............ | 438/587 |
| 6,482,727 B2 * | 11/2002 | Enomoto et al. | ............ | 438/586 |
| 6,518,130 B1 * | 2/2003 | Ohno | ............ | 438/275 |
| 6,518,153 B1 * | 2/2003 | Lin et al. | ............ | 438/585 |
| 6,548,334 B1 * | 4/2003 | Pham et al. | ............ | 438/196 |
| 6,548,388 B2 * | 4/2003 | Hwang et al. | ............ | 438/587 |
| 6,573,168 B2 * | 6/2003 | Kim et al. | ............ | 438/586 |
| 6,607,950 B2 * | 8/2003 | Henson et al. | ............ | 438/197 |
| 6,607,955 B2 * | 8/2003 | Lee | ............ | 438/256 |
| 6,613,621 B2 * | 9/2003 | Uh et al. | ............ | 438/183 |
| 6,716,732 B2 * | 4/2004 | Park et al. | ............ | 438/586 |
| 6,767,814 B2 * | 7/2004 | Kwon et al. | ............ | 438/592 |
| 6,784,084 B2 * | 8/2004 | Kang et al. | ............ | 438/586 |

(Continued)

FOREIGN PATENT DOCUMENTS

JP 2004-273600 9/2004

(Continued)

*Primary Examiner* — N Drew Richards
*Assistant Examiner* — Grant Withers
(74) *Attorney, Agent, or Firm* — Harness, Dickey & Pierce

(57) ABSTRACT

A method of fabricating a contact plug of a semiconductor device is provided, the method includes forming a gate pattern on a substrate, forming a capping pattern to cover an upper surface and sidewalls of the gate pattern, forming an interlayer insulation layer on the substrate such that the interlayer insulation layer exposes an upper surface of the capping pattern, and removing a portion of the capping pattern and the interlayer insulation layer such that the upper surface of the capping pattern is planarized.

20 Claims, 7 Drawing Sheets

U.S. PATENT DOCUMENTS

| | | | |
|---|---|---|---|
| 6,797,611 B1* | 9/2004 | Wu et al. | 438/637 |
| 6,808,975 B2* | 10/2004 | Song et al. | 438/233 |
| 6,846,732 B2* | 1/2005 | Terauchi | 438/586 |
| 6,946,376 B2* | 9/2005 | Chediak et al. | 438/586 |
| 6,963,094 B2* | 11/2005 | Lee et al. | 257/288 |
| 7,060,569 B2* | 6/2006 | Fishburn et al. | 438/275 |
| 7,060,570 B2* | 6/2006 | Fishburn et al. | 438/275 |
| 7,183,188 B2* | 2/2007 | Kronke et al. | 438/592 |
| 7,220,672 B2* | 5/2007 | Miyashita et al. | 438/682 |
| 7,419,896 B2* | 9/2008 | Choi et al. | 438/586 |
| 7,615,475 B2* | 11/2009 | Mieno | 438/586 |
| 7,897,499 B2* | 3/2011 | Lee et al. | 438/586 |
| 2001/0046761 A1* | 11/2001 | Chung et al. | 438/586 |
| 2001/0049185 A1* | 12/2001 | Hosotani et al. | 438/586 |
| 2001/0055867 A1* | 12/2001 | Lee | 438/586 |
| 2002/0086509 A1* | 7/2002 | Park et al. | 438/586 |
| 2002/0177085 A1 | 11/2002 | Lin | |
| 2003/0008453 A1* | 1/2003 | Kang et al. | 438/239 |
| 2005/0142824 A1* | 6/2005 | Kim | 438/586 |
| 2005/0158972 A1* | 7/2005 | Lin et al. | 438/586 |
| 2006/0141696 A1* | 6/2006 | Choi et al. | 438/238 |
| 2006/0154460 A1* | 7/2006 | Yun et al. | 438/586 |
| 2007/0275555 A1* | 11/2007 | Kim | 438/637 |
| 2008/0044990 A1* | 2/2008 | Lee | 438/586 |
| 2009/0305491 A1* | 12/2009 | Takeuchi | 438/587 |
| 2010/0052075 A1* | 3/2010 | Yeh et al. | 257/410 |
| 2010/0059799 A1* | 3/2010 | Kim | 257/288 |
| 2010/0093165 A1* | 4/2010 | Bae et al. | 438/587 |
| 2010/0285658 A1* | 11/2010 | Yeh et al. | 438/586 |

FOREIGN PATENT DOCUMENTS

| | | |
|---|---|---|
| KR | 10-2000-0043219 | 7/2000 |
| KR | 10-2001-0045019 | 6/2001 |

* cited by examiner

US 8,084,344 B2

METHODS OF FABRICATING A SEMICONDUCTOR DEVICE

PRIORITY STATEMENT

This U.S. non-provisional patent application claims the benefit of priority under 35 U.S.C. §119 from Korean Patent Application No. 10-2007-0130190, filed on Dec. 13, 2007, the entire contents of which are hereby incorporated by reference.

BACKGROUND

1. Field

Example embodiments disclosed herein relate to methods of fabricating a semiconductor device, and more particularly, to methods of fabricating a contact plug of a semiconductor device.

2. Description of Related Art

As semiconductor devices become more highly integrated, various techniques for achieving higher integration are being proposed. For electrical connection between a capacitor and a bit line and between source/drain regions, a self aligned contact (SAC) technique is used.

In the SAC technique, after forming an opening that simultaneously exposes gates of a region requiring a contact plug and a semiconductor substrate between the gates, a conductive layer is deposited to fill the opening. The contact plug is formed by planarizing the conductive layer. Subsequently, the capacitor and the bit line, electrically connected to the contact plug, are formed.

If the contact plug of the semiconductor device is formed using the SAC technique, an etch selectivity between an interlayer insulation layer (covering a semiconductor substrate) and a capping pattern (covering a gate electrode) may not be satisfactory during the formation of the opening. Thus, the top height and sidewall thickness of the capping pattern may be insufficient. If over etching is performed to prevent Not Open (N/O) of the semiconductor substrate between the gates during the formation of the opening, the thickness of a shoulder portion between the top portion (or upper surface) and sidewall of the capping pattern may become weaker. If a bar type contact plug is formed, it becomes difficult to control planarization of the conductive layer as a removal rate (RR) of an etch region increases. Accordingly, leakage may occur more frequently between the gate electrode and the contact plug.

An additional plug connected to the contact plug may be formed subsequent to formation of the contact plug. If the over etching is performed during the process for forming the additional plug connected to the contact plug, the shoulder portion of the capping pattern may be further etched. If the shoulder portion of the capping pattern is further etched, the additional plug and the gate electrode are electrically connected to each other. As such, the semiconductor device cannot operate.

As a design rule is reduced due to the higher integration of the semiconductor devices, the above-mentioned limitations reduce a shoulder margin of the capping pattern (e.g., a manufacturing margin for forming the contact plug of the semiconductor device).

SUMMARY

Example embodiments disclosed herein relate to methods of fabricating a semiconductor device, and more particularly, to methods of fabricating a contact plug of a semiconductor device.

At least one example embodiment provides methods of fabricating a semiconductor device capable of increasing a shoulder margin during a process for forming a contact plug of the semiconductor device.

An example embodiment may provide a method of fabricating a semiconductor device including forming a gate pattern on a substrate, forming a capping pattern to cover a top (or upper) surface and sidewalls of the gate pattern, forming an interlayer insulation layer on the substrate such that the interlayer insulation layer exposes a top (or upper) surface of the capping pattern, and removing a portion of the capping pattern and the interlayer insulation layer such that the upper surface of the capping pattern is planarized. Removing a portion of the capping pattern and the interlayer insulation layer may include polishing the capping pattern and the interlayer insulation layer using a chemical mechanical polishing (CMP) method.

According to another example embodiment, forming the gate pattern may include sequentially forming a gate insulation layer and a gate conductive layer on the substrate, and forming a gate insulation layer pattern and a gate electrode by sequentially patterning the gate conductive layer and the gate insulation layer.

Forming the capping pattern may include forming a mask pattern to cover the top (or upper) surface of the gate pattern, and forming a spacer to cover sidewalls of the gate pattern.

According to an example embodiment, forming the mask pattern may include sequentially forming the gate insulation layer, the gate conductive layer and a mask layer on the substrate, and forming a gate insulation layer pattern, the gate electrode and the mask pattern by sequentially patterning the mask layer, the gate conductive layer and the gate insulation layer.

According to at least one example embodiment, forming the spacer may include forming a spacer layer on the substrate having the mask pattern thereon, and etching the spacer layer using an anisotropic etch process.

According to an example embodiment, the mask pattern and the spacer may be formed of the same material. For instance, the mask pattern and the spacer may be formed of a silicon nitride.

According to example embodiments, the interlayer insulation layer may be formed of a silicon oxide.

According to an example embodiment, the CMP method may use a slurry having a polishing speed greater than, or equal to, approximately 200 Å/min with respect to the capping pattern.

According to another example embodiment, the CMP method may use a slurry having a polishing speed grater than, or equal to, approximately 500 Å/min with respect to the capping pattern.

In yet another example embodiment, the CMP method may use a slurry having a polishing speed less than, or equal to, about 100 Å/min with respect to the interlayer insulation layer. In another example embodiment, the CMP method may use a slurry having a polishing speed less than, or equal to, about 50 Å/min with respect to the interlayer insulation layer.

According to an example embodiment, the CMP method may use a slurry having a polishing speed ratio of the capping pattern to the interlayer insulation layer of more than 2:1.

In another example embodiment, the CMP method may use a slurry having a polishing speed ratio of the capping pattern to the interlayer insulation layer of more than 10:1.

The methods according to some example embodiments may include forming an opening to expose a portion of the capping pattern having the planarized upper surface and the substrate adjacent thereto, forming a conductive layer to fill the opening and cover the interlayer insulation layer, and forming a contact plug by planarizing the conductive layer to expose a top (or upper) surface of the capping pattern having the planarized upper surface. The conductive layer may be formed of polysilicon.

According to an example embodiment, a plurality of the gate patterns may be formed on the substrate.

The methods according to other example embodiments may include forming an opening to expose at least one capping pattern having the planarized upper surface and the substrate adjacent thereto, forming a conductive layer to fill the opening and to cover the interlayer insulation layer, and forming a contact plug by planarizing the conductive layer to expose the top (or upper) surface of the capping pattern having the planarized upper surface. According to another example embodiment there may be provided a method of fabricating a semiconductor device, the method may include forming a transistor structure having a planar upper surface on a substrate, removing an interlayer insulating layer adjacent to the transistor structure to form a cavity that exposes a portion of the substrate, and forming a conductive plug in the cavity. The transistor structure may include a gate pattern and a capping pattern. The gate pattern may include, at least, a gate insulation layer pattern and a gate electrode. The capping pattern may include, at least, a mask pattern and spacers.

BRIEF DESCRIPTION OF THE FIGURES

The accompanying figures are included to provide a further understanding of the some example embodiments, and are incorporated in and constitute a part of this specification. The drawings illustrate some example embodiments and, together with the description, serve to explain principles of the present invention. In the figures.

DETAILED DESCRIPTION OF PREFERRED EMBODIMENTS

Figure 1A:
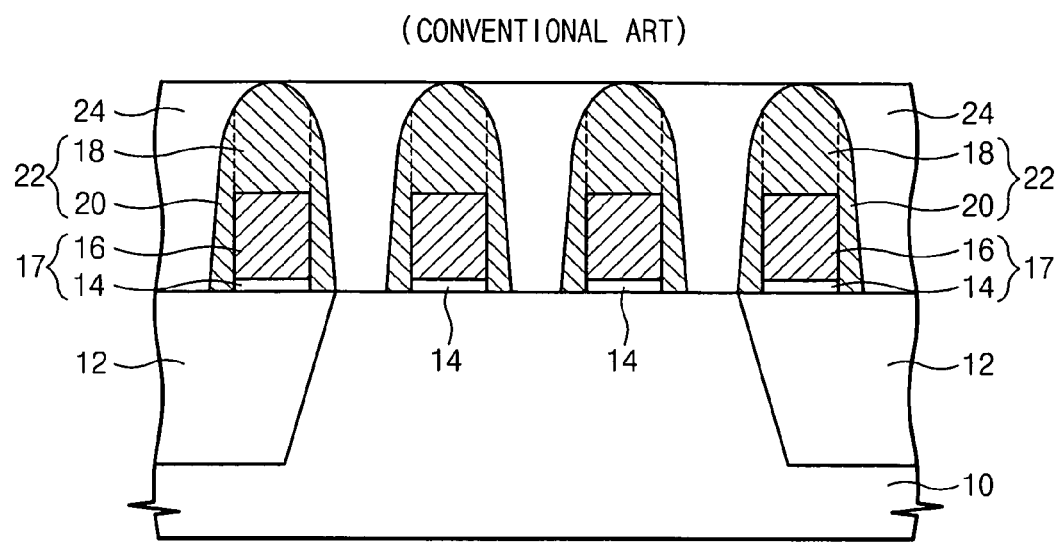
FIGS. 1A through 1E are cross-sectional views illustrating a method of forming a contact plug of a typical (or conventional) semiconductor device.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to example embodiments described.

Example embodiments disclosed herein relate to methods of fabricating a semiconductor device, and more particularly, to methods of fabricating a contact plug of a semiconductor device.

FIGS. 1A through 1E are cross-sectional views illustrating a method of forming a contact plug of a typical (or conventional) semiconductor device.

Referring to FIG. 1A, after forming a device isolation layer 12 to define (or delimit) an active region in a semiconductor substrate 10, a gate insulation layer, a gate conductive layer and a mask layer (not shown) are formed on the semiconductor substrate 10.

First, the mask layer is patterned to form a mask pattern 18. A photoresist pattern (not shown), which is used for an etch mask to pattern the mask layer, may be simultaneously removed using an etch material. Accordingly, an upper surface of the mask pattern 18 may have a circular, or arcuate, cross-sectional profile. The upper surface of the mask pattern 18 can be convex with respect to the upper surface of the substrate 10. During an etch process using the mask pattern 18 as an etch mask, the gate conductive layer and the gate insulation layer are patterned to form a gate pattern 17. As illustrated in the drawings, a plurality of the gate patterns 17 may be formed. The gate pattern 17 includes a gate insulation layer pattern 14 and a gate electrode 16.

Although not illustrated in the drawings, impurity regions may be formed in the active region of the semiconductor substrate 10 adjacent to the gate pattern 17. The impurity regions may be a source/drain regions. The impurity regions may be formed by performing an ion implantation process that uses the gate pattern 17 including the mask pattern as an ion implantation mask.

A spacer layer (not shown) may be formed on the semiconductor substrate 10 where the gate pattern 17 and the mask pattern 18 are formed. The spacer layer may be anisotropically etched to form a spacer 20 on both sides of the gate pattern 17 and the mask pattern 18. The mask pattern 18 and the spacer 20 may constitute one capping pattern 22. Accordingly, the capping pattern 22 may be provided to cover the top (or upper) surface and sidewalls of the gate pattern 17.

By forming and planarizing an insulation layer that covers the semiconductor substrate 10 having the capping pattern 22, an interlayer insulation layer 24 may be formed that exposes the top (or upper surface) of the capping pattern 22.

Figure 1B:
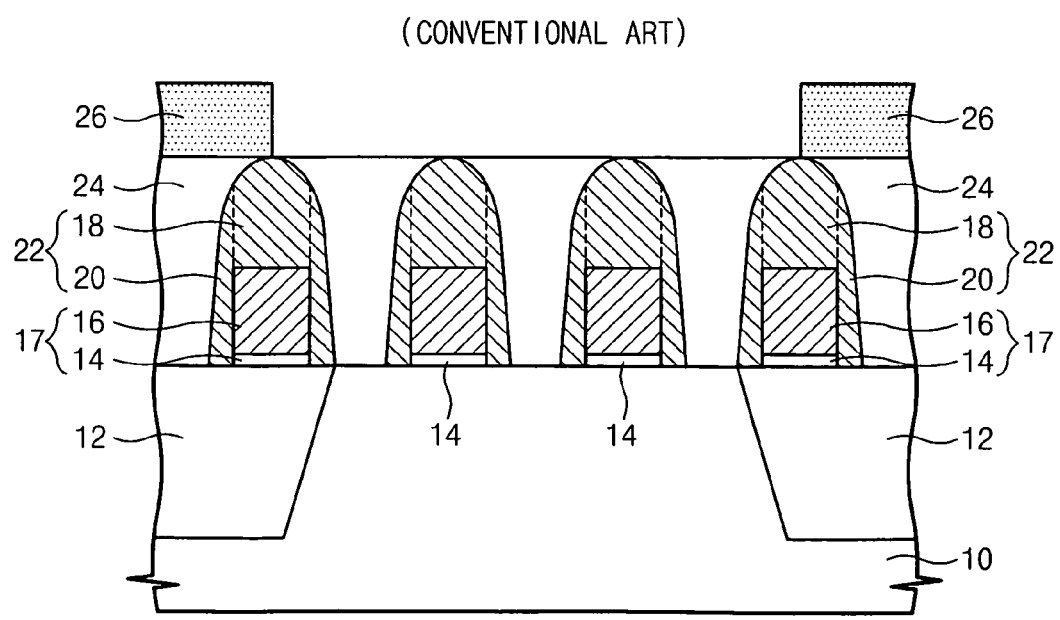
Figure 1C:
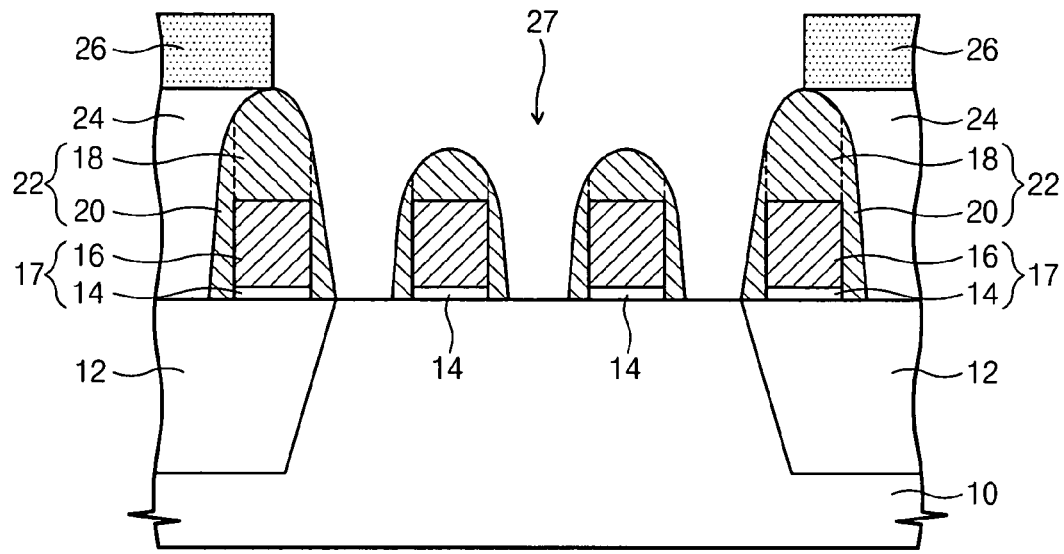

Referring to FIGS. 1B and 1C, a photoresist pattern 26 is formed on the interlayer insulation layer 24 of the semiconductor substrate 10 including the capping pattern 22. The photoresist pattern 26 may expose a portion of the capping pattern 22 and the interlayer insulation layer 24 adjacent thereto. If a plurality of the gate patterns 17 are formed, the photoresist pattern 26 may be formed to expose the top (or upper surface) of the capping patterns 22 and the interlayer insulation layer 24 therebetween.

After etching the exposed interlayer insulation layer 24 using the photoresist pattern 26 as an etch mask, an opening 27 may be formed to expose a top portion (or the upper surface) of the capping pattern 22 and a portion of the semiconductor substrate 10 adjacent thereto over the active region. Over the device isolation region, the opening may expose a portion of the capping pattern adjacent to the active region. Accordingly, the impurity regions (not shown) formed in the active region of the semiconductor substrate 10 may be exposed.

Figure 1D:
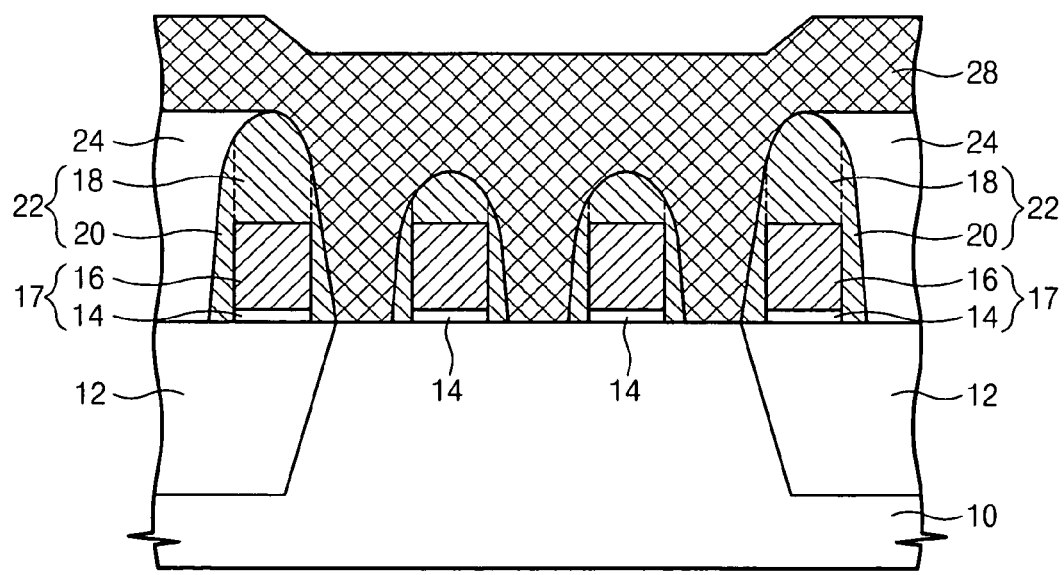
Figure 1E:
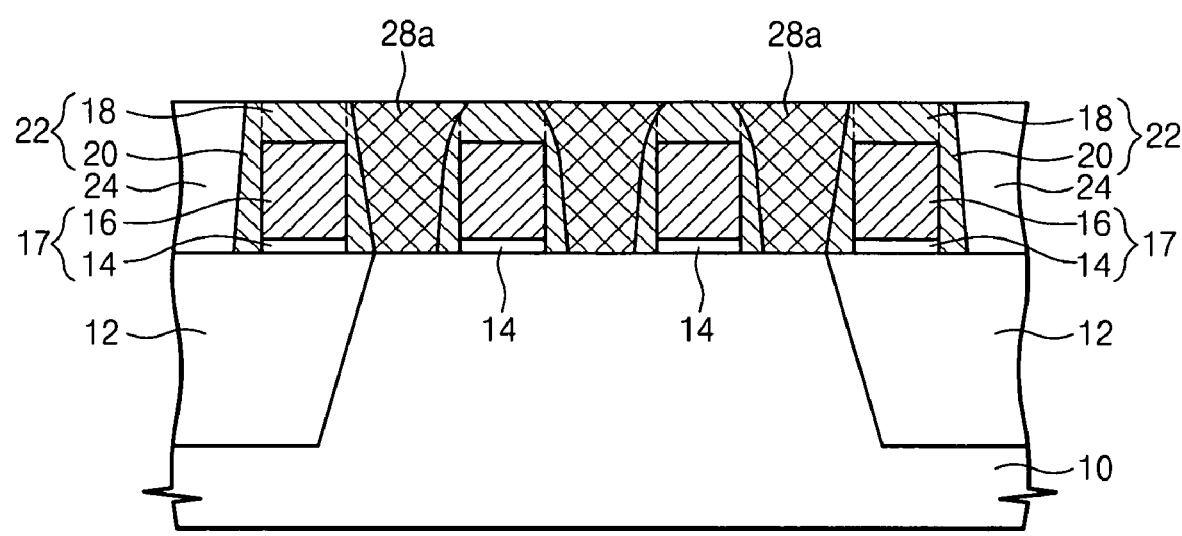

Referring to FIGS. 1D and 1E, after removing the photoresist pattern 26, a conductive layer 28 that covers the interlayer insulation layer 24 and fills the opening 27 may be formed. A contact plug 28a may be formed by planarizing the conductive layer 28 such that the top (or upper surface) of the capping pattern 22 is exposed. If the plurality of gate patterns 17 are formed, planarizing the conductive layer 28 may separate the plurality of contact plugs 28a from each other.

Figure 2A:
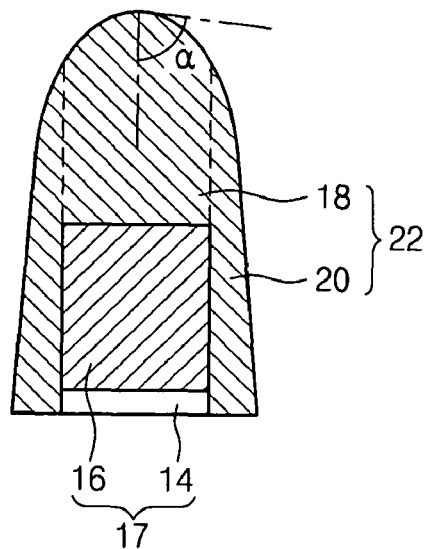
FIGS. 2A and 2B are cross-sectional view and a graph, respectively, for describing an etch rate according to forms of a capping pattern covering a gate pattern.
Figure 2B:
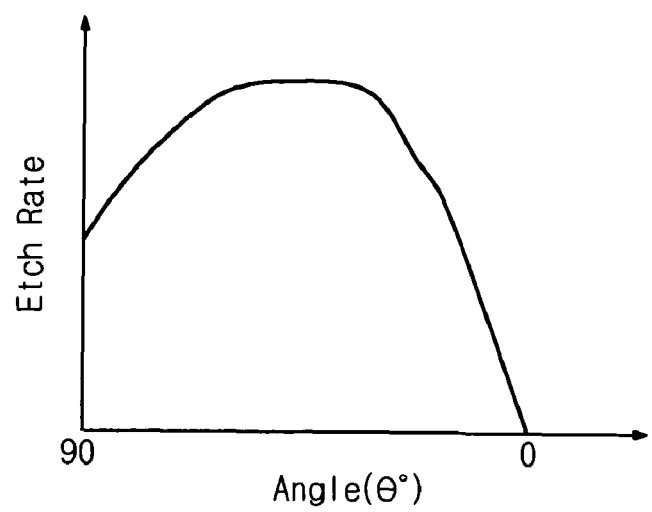

FIGS. 2A and 2B are cross-sectional view and a graph, respectively, for describing an etch rate according to the formation of a capping pattern covering a gate pattern.

Referring to FIGS. 2A and 2B, it shows that an etch rate of a capping pattern 22 may vary according to a top (or upper surface) profile of the capping pattern 22 that covers the gate pattern 17 formed of a gate insulation layer pattern 14 and a gate electrode 16. Namely, the etch rate may vary according to an angle a of a shoulder portion between the top (or upper surface) and sidewalls of the capping pattern 22. That is, FIG. 2B shows that an etch rate may vary according to the angle a between an extension line extending perpendicular to an upper surface of the gate electrode 16 and a tangent line contacting the shoulder portion of the capping pattern 22.

As the angle a at the shoulder portion of the capping pattern 22 becomes smaller, an etch rate rapidly increases. If the angle a is approximately 40° to 50°, the etching rate reaches the maximum value. At the angle a is below 40°, the etch rate is significantly reduced. If the angle a is below 40°, the thickness of the shoulder portion is reduced. Accordingly, if the upper surface of the capping pattern 22 is substantially flat such that the angle a of the shoulder portion is 90°, an etch rate of the capping pattern 22 decreases and a reduction in the thickness of the shoulder portion of the capping pattern 22 can be reduced. Consequently, even if a design rule is reduced as a semiconductor device becomes more highly integrated, a sufficient shoulder margin can be achieved during a manufacturing process of a semiconductor device.

FIGS. 3A through 3F are cross-sectional views illustrating a method of forming a contact plug of a semiconductor device according to an example embodiment.

Figure 3A:
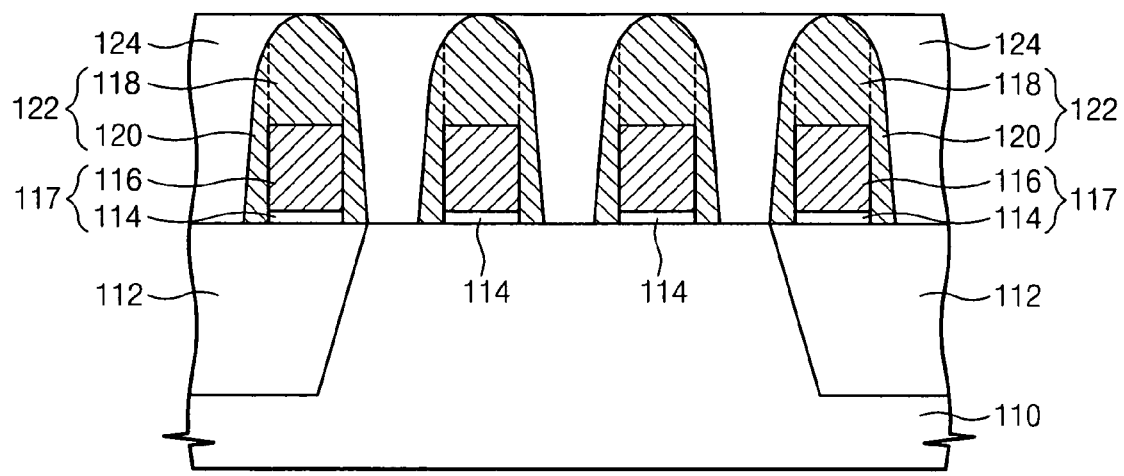
FIGS. 3A through 3F are cross-sectional views illustrating a method of forming a contact plug of a semiconductor device according to an example embodiment.

Referring to FIG. 3A, a gate insulation layer, a gate conductive layer, and a mask layer (not shown) are formed on a semiconductor substrate 110 after forming a device isolation layer 112 to define (or delimit) an active region in the semiconductor substrate 110. The gate insulation layer may be a silicon oxide layer formed using a thermal oxide process. The gate conductive layer may be formed of polysilicon. The mask layer may be formed of a silicon nitride.

A mask pattern 118 is formed by patterning the mask layer. A photoresist pattern (not shown), which is used as an etch mask for patterning the mask layer, may be simultaneously removed by an etch material. An upper surface of the mask pattern 118 can have a circular, or arcuate, cross-sectional profile. The upper surface of the mask pattern 118 can be convex with respect to the upper surface of the substrate 110. By performing an etch process using the mask pattern 118 as an etch mask, the gate conductive layer and the gate insulation layer are patterned to form a gate pattern 117. As illustrated in the drawings, a plurality of gate patterns 117 may be formed on the substrate 110. Each of the gate patterns 117 includes the gate insulation layer pattern 114 and the gate electrode 116.

Although not illustrated in the drawings, impurity regions may be formed in the active region of the semiconductor substrate 110 adjacent to the gate patterns 117. The impurity regions may be source/drain regions. The impurity regions may be formed by performing an ion implantation process that uses the gate pattern 117 and the mask pattern 118 as an ion implantation mask.

A spacer layer (not shown) is formed on the semiconductor substrate 110 where the gate pattern 117 and the mask pattern 118 are formed. The spacer layer may be formed of a silicon nitride. The spacer layer is anisotropically etched to form spacers 120 at both sides of the sidewalls of the gate pattern 117 and the mask pattern 118. Because the mask pattern 118 and the spacer 120 are formed of the same material (e.g., a silicon nitride), a capping pattern 122 is formed that includes the mask pattern 118 and the spacer 120. Accordingly, the capping pattern 122 covers the top (or upper surface) and sidewalls of the gate pattern 117.

An insulation layer (not shown), which covers the semiconductor substrate 110 having the capping pattern 122, is formed and planarized to form an interlayer insulation layer 124 that exposes the top (or upper surface) of the capping pattern 122. The interlayer insulation layer 124 may be formed of a silicon oxide.

Figure 3B:
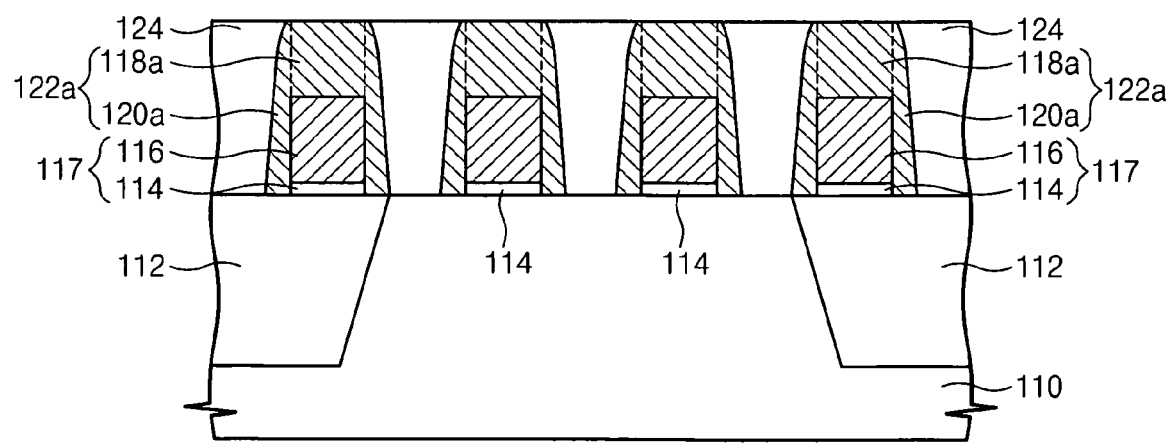

Referring to FIG. 3B, the interlayer insulation layer 124 and the capping pattern 122 are polished by a chemical mechanical polishing (CMP) method to form a capping pattern 122a having the planarized upper surface. As illustrated in FIGS. 2A and 2B, because the angle of a shoulder portion of the capping pattern 122a having the planarized upper surface is maintained at 90°, the etch rate of the capping pattern 122a having the planarized upper surface decreases and a reduction in the thickness of the shoulder portion of the capping pattern 122a having the planarized upper surface is reduced.

The CMP method may use a slurry having a polishing speed greater than, or equal to, about 200 Å/min with respect to the capping pattern 122. The CMP method may use a slurry having polishing speed greater than, or equal to, approximately 500 Å/min with respect to the capping pattern 122. The CMP method may use a slurry having polishing speed less than, or equal to, about 100 Å/min with respect to the interlayer insulation layer 124. The CMP method may use slurry having polishing speed less than, or equal to, 50 Å/min with respect to the interlayer insulation layer 124.

The CMP method may use a slurry wherein a polishing speed ratio of the capping pattern 122 to the interlayer insulation layer 124 may be more than 2:1. The CMP method may use a slurry wherein a polishing speed ratio of the capping pattern 122 to the interlayer insulation layer 124 maybe more than 10:1.

Because the capping pattern 122 and the interlayer insulation layer 124 are planarized by the CMP method usinga slurry having a high etch selectivity with respect to the capping pattern 122, the capping pattern 122a may be formed with a planarized upper surface.

Figure 3C:
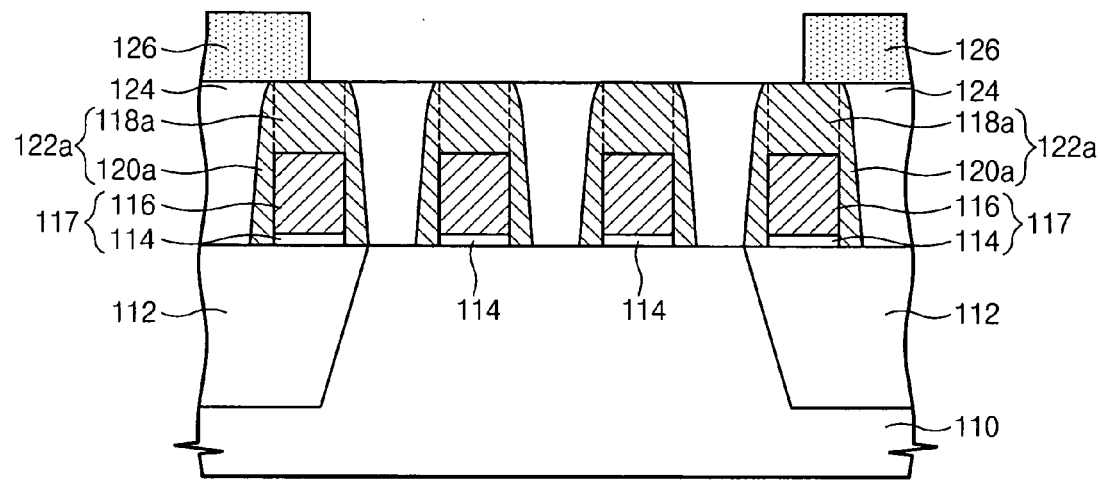
Figure 3D:
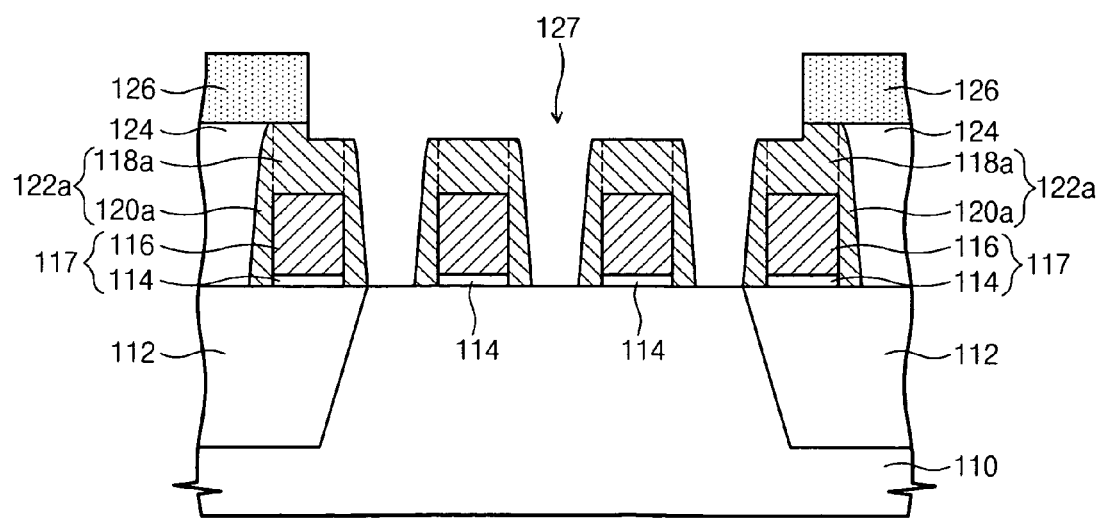

Referring to FIGS. 3C and 3D, a photoresist pattern 126 is formed on the interlayer insulation layer 124 of the semiconductor substrate 110 including the capping pattern 122a with the planarized upper surface. The photoresist pattern 126 may expose a portion of the capping pattern 122a having the planarized upper surface and the interlayer insulation layer 124 adjacent thereto. If a plurality of gate patterns 117 are formed on the substrate 110, the photoresist pattern 126 may expose the upper surface of the capping patterns 122a and the interlayer insulation layer 124 formed between them.

By performing an etch process using the photoresist pattern 126 as an etch mask, an opening 127 may be formed to expose the top portion (or upper surface) of the capping pattern 122a having the planarized upper surface and the semiconductor substrate 110 adjacent thereto. Accordingly, impurity regions formed in the active region of the semiconductor substrate 110 may be exposed. During an etch process for forming the opening 127, the thickness of the top portion (or upper surface) of the capping pattern 122a having the planarized upper surface exposed by the photoresist pattern 126 may become thinner. According to another example embodiment, the thickness of the top portion (or upper surface) of the capping pattern 122a having the planarized upper surface covered by the photoresist pattern 126 may be maintained (or remain the same).

Prior to forming the photoresist pattern 126, a buffer oxide layer (not shown) may be formed on the interlayer insulation layer 124 of the semiconductor substrate 110 including the capping pattern 122a. The buffer oxide layer may be formed of a silicon oxide. In order to form the opening 127, the buffer oxide layer may be used to obtain a process margin of an etch process.

Figure 3E:
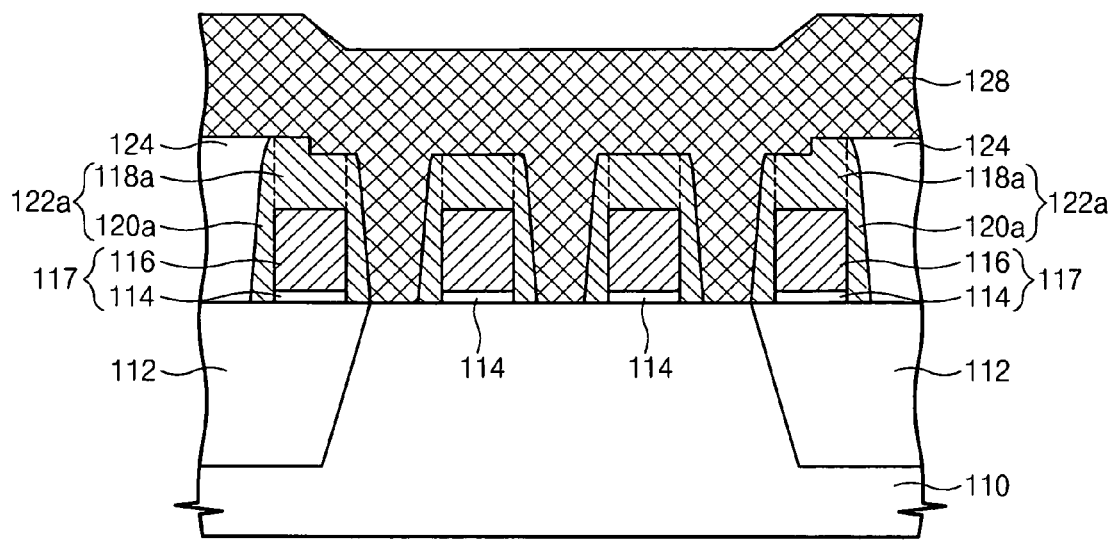
Figure 3F:
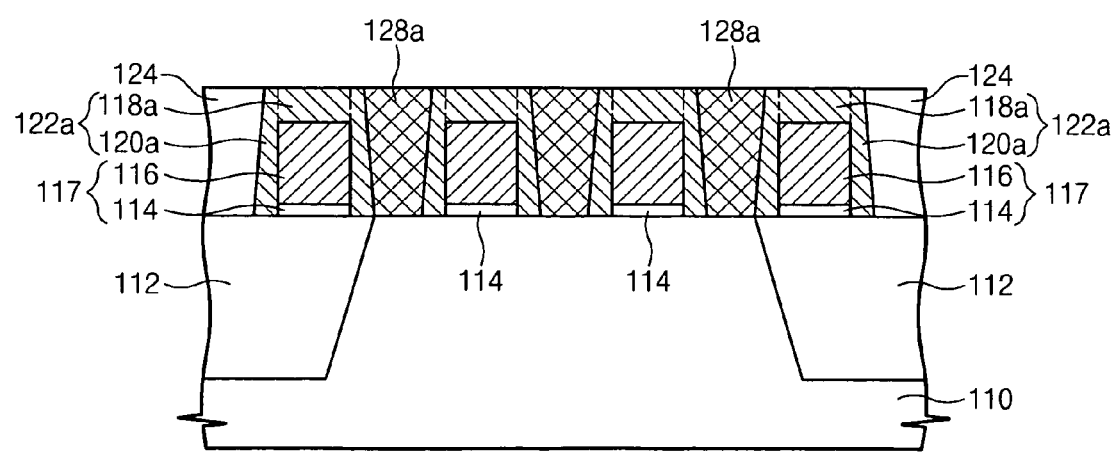

Referring to FIGS. 3E and 3F, after removing the photoresist pattern 126, a conductive layer 128 is formed. The conductive layer 128 may fill the opening 127 and may cover the interlayer insulation layer 124. The conductive layer 128 may be formed of polysilicon.

A contact plug 128a is formed by planarizing the conductive layer 128 to expose the top (or upper surface) of the capping pattern 122a. The conductive layer 128 may be planarized by performing a CMP method. If the plurality of gate patterns 117 are formed on the substrate 110, planarizing the conductive layer 128 separates the contact plugs 128a from each other.

By forming a contact plug of a semiconductor device using a method according to an example embodiment during the formation of an opening used for the contact plug, the amount of a capping pattern lost by insufficient etch selectivity between an interlayer insulation layer and the capping pattern can be reduced. The thickness of a shoulder portion between the upper surface and sidewall of the capping pattern can be not reduced. Accordingly, there is provided a method of fabricating a semiconductor device capable of reducing leakage occurrence between a gate electrode and a contact plug. Additionally, even if the shoulder portion of the capping pattern is further etched by over etching, the gate electrode may not be exposed during a later process for forming an additional plug connected to the contact plug. Accordingly, there is provided a method of fabricating a semiconductor device capable of increasing semiconductor device reliability.

Furthermore, a dishing phenomenon, which occurs during a CMP process for forming a contact plug, can be reduced because the top portion (or upper surface) of a capping pattern has a planarized profile. Accordingly, there is provided a method of fabricating a semiconductor device capable of reducing profile distribution of the contact plug. Consequently, a desired margin for the CMP process can be obtained.

As mentioned above, according to an example embodiment, because the top portion (or upper surface) of the capping pattern covering the gate pattern has a planarized profile, the shoulder margin of the capping pattern may be increase. Accordingly, a more reliable semiconductor device is provided.

Furthermore, because the top portion (or upper surface) of the capping pattern covering the gate pattern has a planarized profile, a desired margin of a CMP process can be obtained. Accordingly, a more reliable semiconductor device is provided.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of fabricating a semiconductor device, the method comprising:
   forming a gate pattern on a substrate;
   forming a capping pattern that covers an upper surface and sidewalls of the gate pattern, the capping pattern having a convex upper surface with respect to an upper surface of the substrate;
   forming an interlayer insulation layer on the substrate such that an upper surface of the capping pattern is exposed;
   removing a portion of the capping pattern and the interlayer insulation layer such that the upper surface of the capping pattern is planarized; and
   forming an opening to expose the substrate adjacent to the capping pattern, after the removing the portion of the capping pattern and the interlayer insulation layer.

2. The method of claim 1, wherein the forming a gate pattern comprises:
   sequentially forming a gate insulation layer and a gate conductive layer on the substrate; and
   forming a gate insulation layer pattern and a gate electrode by sequentially patterning the gate conductive layer and the gate insulation layer.

3. The method of claim 1, wherein the forming a capping pattern comprises:
   forming a mask pattern that covers the upper surface of the gate pattern; and
   forming a spacer that covers the sidewalls of the gate pattern.

4. The method of claim 3, wherein the forming a mask pattern comprises:
   sequentially forming a gate insulation layer, a gate conductive layer, and a mask layer on the substrate; and
   forming a gate insulation layer pattern, a gate electrode and the mask pattern by sequentially patterning the mask layer, the gate conductive layer and the gate insulation layer.

5. The method of claim 3, wherein the forming a spacer comprises:
   forming a spacer layer on the substrate having the mask pattern; and
   etching the spacer layer using an anisotropic etch process.

6. The method of claim 3, wherein the mask pattern and the spacer are formed of a same material.

7. The method of claim 6, wherein the same material includes silicon nitride.

8. The method of claim 1, wherein the interlayer insulation layer is formed of a silicon oxide.

9. The method of claim 1, wherein the removing a portion of the capping pattern and the interlayer insulation layer includes performing a chemical mechanical polishing (CMP) method, the CMP method uses a slurry having a polishing speed greater than, or equal to, approximately 200 Å/min with respect to the capping pattern.

10. The method of claim 1, wherein the removing a portion of the capping pattern and the interlayer insulation layer includes performing a chemical mechanical polishing (CMP) method, the CMP method uses a slurry having a polishing speed greater than, or equal to, approximately 500 Å/min with respect to the capping pattern.

11. The method of claim 1, wherein the removing a portion of the capping pattern and the interlayer insulation layer includes performing a chemical mechanical polishing (CMP) method, the CMP method uses a slurry having a polishing speed less than, or equal to, approximately 100 Å/min with respect to the interlayer insulation layer.

12. The method of claim 1, wherein the removing a portion of the capping pattern and the interlayer insulation layer includes performing a chemical mechanical polishing (CMP) method, the CMP method uses a slurry having a polishing speed less than, or equal to, approximately 50 Å/min with respect to the interlayer insulation layer.

13. The method of claim 1, wherein the removing a portion of the capping pattern and the interlayer insulation layer includes performing a chemical mechanical polishing (CMP) method, the CMP method uses a slurry having a polishing speed ratio of the capping pattern to the interlayer insulation layer of more than 2:1.

14. The method of claim 13, wherein the polishing speed ratio of the capping pattern to the interlayer insulation layer is more than 10:1.

15. The method of claim 1, further comprising:
   forming a conductive layer that fills the opening; and
   forming a contact plug by planarizing the conductive layer.

16. The method of claim 1, wherein the conductive layer is formed of polysilicon.

17. The method of claim 1, wherein a plurality of gate patterns are formed on the substrate.

18. The method of claim 17, further comprising:
   forming a conductive layer that fills the opening and covers the exposed capping pattern; and
   forming a contact plug by planarizing the conductive layer.

19. A method of fabricating a semiconductor device, the method comprising:
   forming a transistor structure having a planar upper surface on a substrate;
   forming a capping pattern that covers an upper surface and sidewalls of the gate pattern, the capping pattern having a convex upper surface with respect to an upper surface of the substrate;
   removing a portion of the capping pattern and an interlayer insulating layer adjacent to the transistor structure;
   forming a cavity that exposes a portion of the substrate after the removing step; and
   forming a conductive plug in the cavity.

20. A method of fabricating a semiconductor device, the method comprising:
   forming a gate pattern on a substrate;
   forming a capping pattern that covers an upper surface and sidewalls of the gate pattern, the capping pattern having a convex upper surface with respect to an upper surface of the substrate;
   forming an interlayer insulation layer on the substrate such that an upper surface of the capping pattern is exposed; and
   removing a portion of the capping pattern and the interlayer insulation layer such that the upper surface of the capping pattern is planarized.

* * * * *